United States Patent
Tamura

[19]

[11] Patent Number: 5,912,566
[45] Date of Patent: Jun. 15, 1999

[54] SWITCH OPEN-CLOSE STATE-DETECTING CIRCUIT

[75] Inventor: Hideki Tamura, Miyagi-ken, Japan

[73] Assignee: Alps Electric Co., Ltd., Tokyo, Japan

[21] Appl. No.: 08/949,273

[22] Filed: Oct. 13, 1997

[30] Foreign Application Priority Data

Oct. 14, 1996 [JP] Japan .................................. 8-270920

[51] Int. Cl.$^6$ .................................................. H03K 5/19
[52] U.S. Cl. ................................ 327/20; 327/18; 327/530
[58] Field of Search ................................ 327/20, 18, 530, 327/51, 54, 63, 65; 364/550

[56] References Cited

U.S. PATENT DOCUMENTS

| | | | |
|---|---|---|---|
| 4,605,863 | 8/1986 | Toudo et al. ............................ | 307/269 |
| 4,692,709 | 9/1987 | Shvartsman ............................ | 328/108 |
| 5,382,839 | 1/1995 | Shinohara ............................ | 327/545 |

*Primary Examiner*—Kenneth B. Wells
*Assistant Examiner*—An T. Luu
*Attorney, Agent, or Firm*—Brinks Hofer Gilson & Lione

[57] ABSTRACT

A switch open-close state-detecting circuit for supplying an interrupt signal to a control terminal of a controller in response to a change of state of a switch to either open or closed state by giving a monitoring voltage to a plurality of switches to supply a change of the monitoring voltage corresponding to opening or closing of the switches to a plurality of input terminals of the controller by detecting the change of the monitoring voltage to supply to the control terminal of the controller for controlling the operation modes of the controller. The switch open-close state-detecting circuit has a control IC including the same number of a plurality of pairs of input terminal and a plurality of output terminals for generating interrupt signals at the output terminals only when supply voltages to pairs of input terminals of the control IC are not equal, and delay circuits connected between the input terminals of the control IC. The change of the monitoring voltage is supplied to the pairs of input terminals of the control IC to supply the interrupt signal from the output terminals of the control IC to the control terminal of the controller.

3 Claims, 3 Drawing Sheets

SWITCH OPEN-CLOSE STATE-DETECTING CIRCUIT

BACKGROUND OF INVENTION

1. Field of the Invention

The present invention relates to a switch open-close state-detecting circuit, particularly to a switch open-close state-detecting circuit which detects a change of a state in a plurality of switches either from a closed state to an open state or from the open state to the closed state to make it possible to control the operation modes of a controller with a detected output.

2. Description of the Related Art

In various control apparatuses with a controller consisted with a microcomputer, such as, for example, automotive control apparatuses mounted in an automobile, it is typical that the operation mode of the controller is automatically shifted from the normal mode to the sleep mode with small power consumption to suppress needless power consumption in the controller, when a predetermined time passed after the control apparatus comes into the non-working condition and all of the plurality of operating switches are shifted into the non-controlling state.

On the other hand, to return the controller operation mode from the sleep mode to the normal mode, it is required to supply an interrupt signal to a control terminal of the controller and this interrupt signal is produced with a switch open-close state-detecting circuit. Namely, the switch open-close state-detecting circuit detects that any one of a plurality of switches is operated and the operated switch is shifted from the non-controlling state to the controlling state to generate the interrupt signal, or example, for changing from the high level state to the low level state to supply it to the control terminal of the controller to return the controller operation mode from the sleep mode to the normal mode.

FIG. 3 is a circuit diagram illustrating an example of a construction of a known switch open-close state-detecting circuit and a circuit surrounding it, which is used in an automotive controlling apparatus.

As shown in FIG. 3, a circuit portion which includes the switch open-close state-detecting circuit 40 comprises a plurality (having n units) of manually operated switches $31_1$, $31_2$, $31_3$, ..., $31_{(n-1)}$, $31_n$, a controller 32 including at least n units of input terminals $I_1, I_2, I_3, \ldots, I_{(n-1)}, I_n$ and a control terminal $I_c$, a resistor $33_1$ and a diode $34_1$ connected in series between the switch $31_1$ and the input terminal $I_1$, a resistor $33_2$ and a diode $34_2$ connected in series between the switch $31_2$ and the input terminal $I_2$, a resistor $33_3$ and a diode $34_3$ connected in series between the switch $31_3$ and the input terminal $I_3$, ..., a resistor $33_{(n-1)}$ and a diode $34_{(n-1)}$ connected in series between the switch $31_{(n-1)}$ and the input terminal $I_{(n-1)}$, a resistor $33_n$ and a diode $34_n$ connected in series between the switch $31_n$ and the input terminal $I_n$, a capacitor $35_1$ connected between the node of the resistor $33_1$ and the diode $34_1$ and a grounding point, a capacitor $35_2$ connected between the node of the resistor $33_2$ and the diode $34_2$ and a grounding point, a capacitor $35_3$ connected between the node of the resistor $33_3$ and the diode $34_3$ and a grounding point, ..., a capacitor $35_{(n-1)}$ connected between the node of the resistor $33_{(n-1)}$ and the diode $34_{(n-1)}$ and a grounding point, a capacitor $35_n$ connected between the node of the resistor $33_n$ and the diode $34_n$ and a grounding point, a power supplying resistor $36_1$ connected in series along with a detecting resistor 41 to be described later between the switch $31_1$ and a power source $V_{cc}$, a power supplying resistor $36_2$ connected in series along with a detecting resistor 41 to be described later below between the switch $31_2$ and the power source $V_{cc}$, a power supplying resistor $36_3$ connected between the switch $31_3$ and the power source $V_{cc}$, ..., a power supplying resistor $36_{(n-1)}$ connected between the switch $31_{(n-1)}$ and the power source $V_{cc}$, a power supplying resistor $36_n$ connected between the switch $31_n$ and the power source $V_{cc}$, a power supplying resistor $37_1$ connected between the input terminal $I_1$ and a power source $V_{dd}$, a power supplying resistor $37_2$ connected between the input terminal $I_2$ and the power source $V_{dd}$, a power supplying resistor $37_3$ connected between the input terminal $I_3$ and the power source $V_{dd}$, ..., a power supplying resistor $37_{(n-1)}$ connected between the input terminal $I_{(n-1)}$ and the power source $V_{dd}$, and a power supplying resistor $37_n$ connected between the input terminal $I_n$ and the power source $V_{dd}$.

Also, the switch open-close state detecting circuit 40 comprises a detecting resistor 41, a capacitor 42 and a diode 43 connected in parallel between the resistor $36_1$ (and the resistor $36_2$) and the power source $V_{cc}$, the first inverter 44 and the second inverter 45 cascade-connected between the node of a resistor $36_1$ and the detecting resistor 41 and the control terminal $I_c$, a capacitor 46 connected between the output of the first inverter 44 and a grounding point and a power supplying resistor 47 connected between the control terminal $I_c$ and the source $V_{dd}$.

The circuit portion including the switch open-close state-detecting circuit 40 in accordance with the above mentioned construction generally works as described below;

In the normal mode of the operation modes of the controller 32, when the switch $31_1$ is in the open state, the source voltage of $V_{cc}$ is applied to the cathode of the diode $34_1$ via the detecting resistor 41, the power supplying resistor $36_1$, and the resistor $33_1$. On the other hand, since the source voltage of $V_{dd}$ is applied to the anode of the diode $34_1$ via the power supplying resistor $37_1$, the source voltage of $V_{dd}$ is supplied to the input terminal $I_1$ of the controller 32 as a high level voltage. At this time the controller 32 does not respond at all to the high level voltage supplied to the input terminal $I_1$. Also, this applies similarly to the case in which the other switches $31_2$, $31_3$, ..., $31_{(n-1)}$, $31_n$ are in the open state as in the case in which the switch $31_1$ is open.

Then, when the state of the switch $31_1$ changes from the open state to the closed state, the node of the power supplying resistor $36_1$ and the resistor $33_1$ is grounded by the closed switch $31_1$ causing the cathode voltage of the diode $34_1$ plunge from the source voltage of $V_{cc}$ down almost to the ground voltage. On the other hand, while the source voltage of $V_{dd}$ is still applied to the anode of the diode $34_1$ via the power supplying resistor $37_1$, the diode $34_1$ is turned to the conducting state due to the plunging-down of the cathode voltage, which lead to the plunging of the anode voltage down to the junction voltage of the diode $34_1$ or such a low voltage, for example, as low as nearly 0.6 V. This low voltage causes to shift the input terminal $I_1$ to the low level voltage state. At this moment the controller 32 performs a control operation corresponding to the function of the switch $31_1$ by responding to the change of Voltage from the high level state to the low level state supplied to the input terminal $I_1$. Also, when the other switches $31_2$, $31_3$, ..., $31_{(n-1)}$, $31_n$ change from the open state to the closed state, the controller 32 performs a control operation corresponding to the function of a closed switch $31_2$, $31_3$, ..., $31_{(n-1)}$, $31_n$, similarly as in the case of the closing of the switch $31_1$.

When the above stated operations is performed, once the use of the automotive control apparatus or the circuit portion including the switch open-close state-detecting circuit 40 is completed and all of the switches $31_1, 31_2, 31_3, \ldots, 31_{(n-1)}, 31_n$ are kept in the open state longer than a predetermined time, the controller 32 is driven by a sleep setting circuit which is not shown in the drawings to shift the operation mode from the normal mode to the sleep mode with lower power consumption.

Then, when the state of any one of the switches, for example the switch $31_1$, is changed from the open state to the closed one in order to use the automotive control apparatus or the circuit portion including the switch open-close state-detecting circuit 40 again, the voltage at the node of the power supplying resistor $36_1$ and resistor $33_1$ goes down to conduct the diode $34_1$ for supplying the low level voltage to the input terminal $I_1$ as stated above. At this moment a current flows through the detecting resistor 41 in the switch open-close state-detecting circuit 40 to supply the low level voltage to the input terminal of the first inverter 44 due to the voltage drop at the detecting resistor 41 generating a high level voltage at its output terminal, then supplying the high level voltage to the input terminal of the second inverter 45 to generate a low level voltage at its output terminal. Then, in place of the source voltage (high level) of $V_{dd}$ supplied via the power supplying resistor 47, the low level voltage or an interrupt signal for changing from the high level state to the low level state is applied to the control terminal $I_c$ and the operation mode of the controller 32 returns from the sleep mode to the normal mode to perform a control operation corresponding to the function of the switch $31_1$ communicated to the input terminal $I_1$.

Also, while the controller 32 is in the sleep mode, in case the switch $31_2$ is closed in addition to the switch $31_1$, the same operation takes place as in the case of closing the switch $31_1$ stated above.

As mentioned above, the switch open-close state-detecting circuit 40 detects, in the sleep mode of the controller 32, that the switch $31_1$ or the switch $31_2$ turned from the open state to the closed state and according to the detected result, it drives the input terminal $I_c$ of the controller 32 with the interrupt signal for changing the high level state to the low level state, the operation mode of the controller 32 returns from the sleep mode to the normal mode. From then on, if any one of the switches $31_1, 31_2, 31_3, \ldots, 31_{(n-1)}, 31_n$ is closed, a control operation is performed corresponding to the function of the closed one.

The above stated known switch open-close state-detecting circuit 40 operates to return the operation mode of the controller 32 from the sleep mode to the normal mode, only when the switch $31_1$ or the switch $31_2$ is operated from the open state to the closed state to supply the interrupt signal for changing the high level state to the low level state to the input terminal $I_c$ of the controller 32.

However, some kind of switches for an automotive control apparatus has a requirement to have the operation mode of the controller 32 return from the sleep mode to the normal mode, when a switch is operated from the closed state to the open state to supply the interrupt signal for changing from the high level state to the low level state to the input terminal $I_c$ of the controller 32. The known switch open-close state-detecting circuit 40 above stated has a problem that, for such category of switches as above, it cannot supply the desired interrupt signal to the input terminal $I_c$ of the controller 32 and it cannot return the operation mode of the controller 32 from the sleep mode to the normal mode.

SUMMARY OF THE INVENTION

It is an object of the present invention to provide a solution for the above problem by providing a switch open-close state-detecting circuit which can produce a desired interrupt signal to a control terminal of a controller even when a switch changes its states to either open or closed state.

To achieve the above stated object, the switch open-close state-detecting circuit of the present invention comprises a control integrated circuit including a plurality of pairs of input terminals and a plurality of output terminals in a number corresponding to that of the pairs of the input terminals for generating a detecting voltage at a corresponding output terminals only when the voltages supplied to a pair of input terminals is not equal and a plurality of delay circuits each connected between input terminals of a plurality of pairs of input terminals and is provided with means for generating an interrupt signal to be fed from the plurality of output terminals to a control terminal of the controller by applying change of a monitoring voltage for monitoring the operation state corresponding to opening and closing of the plurality of the switches.

According to the above stated means, when the level of the monitoring voltage which is applied to each pair of input terminals of the control IC changes either from the high level state to the low level state or from the low level state to the high level state, an interrupt signal for changing from the high level state to the low level state is supplied to an output terminal corresponding to the pair of input terminals, enabling to supply a desired interrupt signal to the control terminal of the controller irrespective of change of switching state to either open or closed state.

In an embodiment of the present invention, the switch open-close state-detecting circuit gives a plurality of switches the monitoring voltage and when it supplies change of the monitoring voltage corresponding to open-close states of a plurality of switches to a plurality of the input terminals of the controller separately, a switch open-close state-detecting circuit is provided for controlling the controller operation mode by detecting and supplying change in the monitoring voltage to the control terminal of the controller and the switch open-close state-detecting circuit comprises a control integrated circuit including a plurality of pairs of input terminals and a plurality of output terminals in a number corresponding to that of the pairs of the input terminals for generating an interrupt signal at a corresponding output terminal only when the voltages supplied between a pair of input terminals is not equal and a plurality of delay circuits each connected between input terminals of a plurality of pairs of input terminals of the control integrated circuit, and it supplies change of the monitoring voltage of a plurality of switches selected out of the plurality of switches to one input terminals of the plurality of pairs of input terminals separately to supply interrupt signals obtained at a plurality of output terminals to the control terminal.

In an example of embodiments of the present invention, the controller is a microcomputer, which is mounted in an automobile for controlling operations of various automotive devices and the plurality of switches various control switches provided in an automobile.

In an example of embodiments of the present invention, the operation modes of the controller are at least the normal mode and the sleep mode.

According to the embodiment of the present invention the monitoring voltage generated from a plurality of switches for monitoring the operation mode is supplied separately to the corresponding plurality of pairs of input terminals of the controlling IC and in the controlling IC it is so constructed as to make an interrupt signal for changing voltage from the high level to the low level to be supplied to output terminals corresponding to the pairs of input terminals when the monitoring voltage applied to each of the pairs of switches changes either from high level state to the low level state or from the low level state to the high level, so that even any of the plurality of switches changes to either open or closed state, it is possible to supply the interrupt signal to the control terminal of the controller to change the operation mode of the controller to one of the modes (for example the sleep mode) to another one (for example the normal mode).

DESCRIPTION OF THE PREFERRED EMBODIMENT

Figure 1:
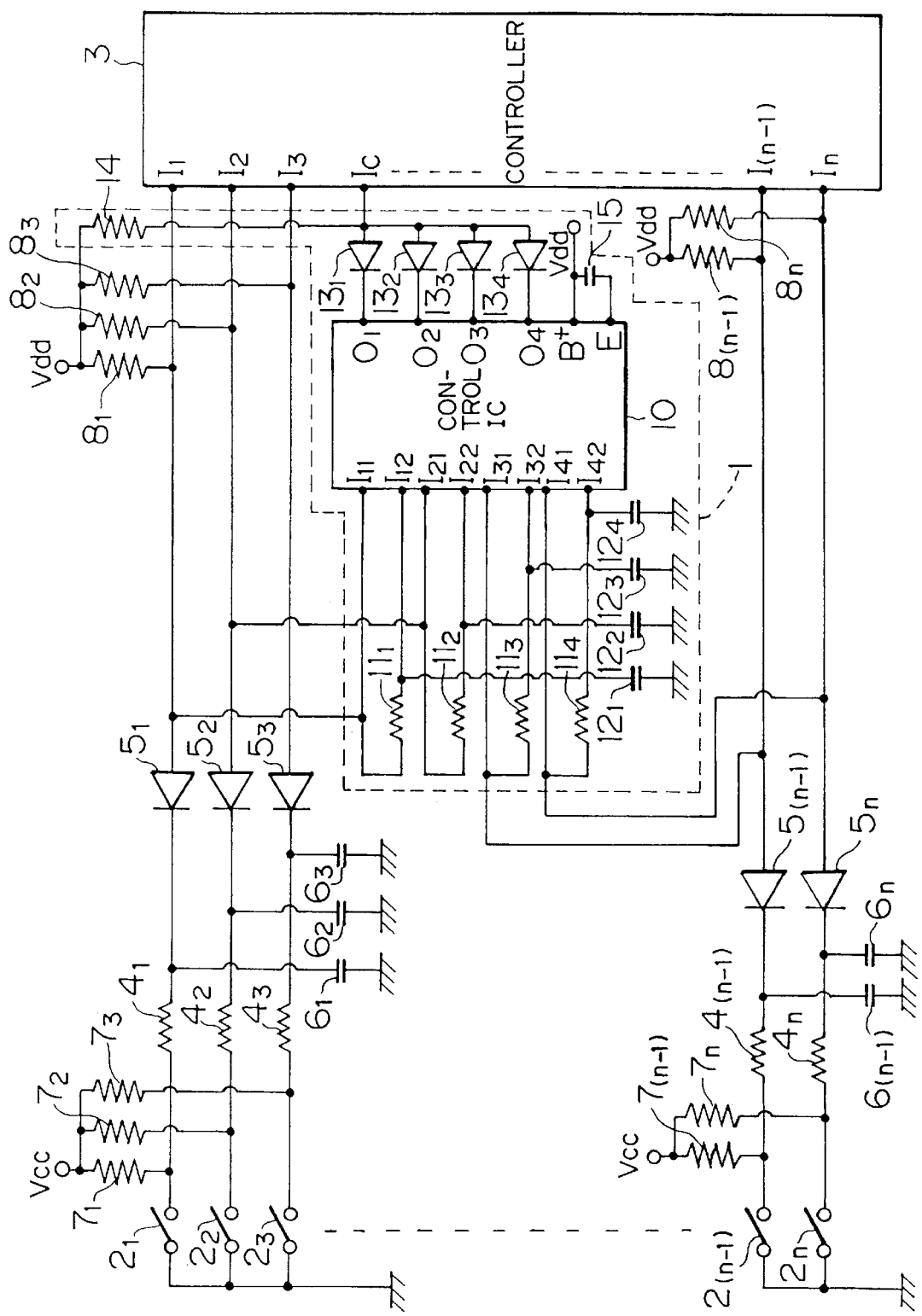
FIG. 1 is a schematic circuit diagram showing the construction of a switch open-close state-detecting circuit which is an embodiment of the present invention and a circuit surrounding it.

Referring now to the drawings, the embodiments of the present invention are described.

FIG. 1 is a schematic circuit diagram showing the construction of a switch open-close state-detecting circuit which is an embodiment of the present invention and a circuit surrounding it, showing an example of application of the switch open-close state-detecting circuit to an automotive control apparatus.

As illustrated in FIG. 1 a circuit portion which includes the switch open-close state-detecting circuit 1 comprises a plurality (having n units) of manually operated switches $2_1$, $2_2$, $2_3$, ..., $2_{(n-1)}$, $2_n$, a controller 3 including at least n units of input terminals $I_1$, $I_2$, $I_3$, ..., $I_{(n-1)}$, $I_n$ and a control terminal $I_c$, a resistor $4_1$ and a diode $5_1$ connected in series between the switch $2_1$ and the input terminal $I_1$, a resistor $4_2$ and a diode $5_2$ connected in series between the switch $2_2$ and the input terminal $I_2$, a resistor $4_3$ and a diode $5_3$ connected in series between the switch $2_3$ and the input terminal $I_3$, ..., a resistor $4_{(n-1)}$ and a diode $5_{(n-1)}$ connected in series between the switch $2_{(n-1)}$ and the input terminal $I_{(n-1)}$, a resistor $4_n$ and a diode $5_n$ connected in series between the switch $2_n$ and the input terminal $I_n$, a capacitor $6_1$ connected between the node of the resistor $4_1$ and the diode $5_1$ and a grounding point, a capacitor $6_2$ connected between the node of the resistor $4_2$ and the diode $5_2$ and a grounding point, a capacitor $6_3$ connected between the node of the resistor $4_3$ and the diode $5_3$ and a grounding point, ..., a capacitor $6_{(n-1)}$ connected between the node of the resistor $4_{(n-1)}$ and the diode $5_{(n-1)}$ and a grounding point, a capacitor $6_n$ connected between the node of the resistor $4_n$ and the diode $5_n$ and a grounding point, a power supplying resistor $7_1$ connected between the switch $2_1$ and a power source $V_{cc}$, a power supplying resistor $7_2$ connected between the switch $2_2$ and a power source $V_{cc}$, a power supplying resistor $7_3$ connected between the switch $2_3$ and a power source $V_{cc}$, ..., a power supplying resistor $7_{(n-1)}$ connected between the switch $2_{(n-1)}$ and a power source $V_{cc}$, a power supplying resistor $7_n$ connected between the switch $2_n$ and a power source $V_{cc}$, a power supplying resistor $8_1$ connected between the input terminal $I_1$ and a power source $V_{dd}$, a power supplying resistor $8_2$ connected between the input terminal $I_2$ and a power source $V_{dd}$, a power supplying resistor $8_3$ connected between the input terminal $I_3$ and a power source $V_{dd}$, ..., a power supplying resistor $8_{(n-1)}$ connected between the input terminal $I_{(n-1)}$ and a power source $V_{dd}$, a power supplying resistor $8_n$ connected between the input terminal $I_n$ and a power source $V_{dd}$.

Also, the switch open-close state-detecting circuit 1 comprises a control integrated circuit (IC) 10 with a plurality of pairs of input terminals $I_{11}$-$I_{12}$, $I_{21}$-$I_{22}$, $I_{31}$-$I_{32}$, $I_{41}$-$I_{42}$, a plurality of output terminals $O_1$, $O_2$, $O_3$, $O_4$, power source terminal B+ and a grounding terminal E, a resistor $11_1$ connected between the pair of input terminals $I_{11}$-$I_{12}$, a resistor $11_2$ connected between the pair of input terminals $I_{21}$-$I_{22}$, a resistor $11_3$ connected between the pair of input terminals $I_{31}$-$I_{32}$, a resistor $11_4$ connected between the pair of input terminals $I_{41}$-$I_{42}$, a capacitor $12_1$ connected between the input terminal $I_{12}$ and a grounding point, a capacitor $12_2$ connected between the input terminal $I_{22}$ and a grounding point, a capacitor $12_3$ connected between the input terminal $I_{32}$ and a grounding point, a capacitor $12_4$ connected between the input terminal $I_{41}$ and a grounding point, a diode $13_1$ connected between the output terminal $O_1$ and the control terminal $I_c$, a diode $13_2$ connected between the output terminal $O_2$ and the control terminal $I_c$, a diode $13_3$ connected between the output terminal $O_3$ and the control terminal $I_c$, a diode $13_4$ connected between the output terminal $O_4$ and the control terminal $I_c$, a power supplying resistor 14 connected between the control terminal $I_c$ and the power source $V_{dd}$ and a smoothing capacitor 15 connected between the power source terminal B+ and the grounding terminal E.

In this case in the control IC 10 the output terminal $O_1$ produces a low level interrupt signal only when voltages supplied to the pair of input terminals $I_{11}$-$I_{12}$ is not equal, the output terminal $O_2$ a low level interrupt signal only when voltages supplied to the pair of input terminals $I_{21}$-$I_{22}$ is not equal, the output terminal $O_3$ a low level interrupt signal only when voltages supplied to the pair of input terminals $I_{31}$-$I_{32}$ is not equal and the output terminal $O_4$ a low level interrupt signal only when voltages supplied to the pair of input terminals $I_{41}$-$I_{42}$ is not equal, respectively. Further, a combination of the resistor $11_1$ and the capacitor $12_1$, a combination of the resistor $11_2$ and the capacitor $12_2$, a combination of the resistor $11_3$ and the capacitor $12_3$, a combination of the resistor $11_4$ and the capacitor $12_4$ comprise voltage delay circuits (low-pass filter type integral network), respectively.

Next, FIGS. 2(a) to (f) are graphical representations in time sequence of an example of voltages obtained in various parts of the circuit including the switch open-close state-detecting circuit 1 of an embodiment of the present invention, in which (a) shows states of "ON" or "OFF" of a switch, for example, the switch $2_1$, (b) the voltage supplied to the input terminal $I_1$ of the controller 3 in response to "ON" and "OFF" of the switch $2_1$, (c) the voltage supplied to the input terminal $I_{11}$ of the control IC 10 in response to "ON" and "OFF" of the switch $2_1$, (d) the voltage similarly supplied to the input terminal $I_{12}$ of the control IC 10 in response to "ON" and "OFF" of the switch $2_1$, (e) the interrupt signal supplied from the output terminal $O_1$ of the control IC 10 and (f) the states of the operation modes of the controller 10. The horizontal axis shows time.

The operation of the circuit portion including the switch open-close state-detecting circuit 1 of the present embodiment with the above stated construction will be explained by referring to FIGS. (a) to (f).

Now, under the normal mode of the controller 3 during such a time period as shown by the time $t_1$ to $t_5$ in FIG. 2(f), if the switch $2_1$ is in an OFF state, as shown in the time period $t_3$ to $t_5$ in FIG. 2(a), then the source voltage $V_{cc}$ is applied to the cathode of the diode $5_1$ via the power supplying resistor $7_1$ and resistor $4_1$ and the source voltage $V_{dd}$ to the anode of the diode $5_1$ via the power supplying resistor $8_1$ and the source voltage $V_{dd}$ is applied to the input terminal $I_1$ of the controller 3 as a high level voltage during $t_3$ to $t_5$ period shown in FIG. 2(b). At this time the controller 3 does not make any response to the high level voltage supplied to the input terminal $I_1$. Also, the same will apply to a case in which anyone of other switches $2_2$, $2_3$, . . . , $2_{(n-1)}$, $2_n$ is in the open state as in the case in which the switch $2_1$ is in the open state.

On the other hand, if the switch $2_1$ is in an ON state as shown in $t_1$ to $t_3$ period in FIG. 2(a), the node of the power supplying resistor $7_1$ and the resistor $4_1$ is grounded via the closed switch $2_1$ and the cathode voltage of the diode $5_1$ drops to approximately the ground voltage and the source voltage $V_{dd}$ is applied to its anode via the power supplying resistor $8_1$, bringing the diode into the conducting state, which cause the low level voltage to be fed into the input terminal $I_1$ as shown in $t_1$ to $t_3$ period in FIG. 2(b) as the anode voltage of the diode $5_1$ goes down to the junction voltage of the diode $5_1$ or a low voltage as low as nearly 0.6 V. At this time the controller 3 performs a control operation corresponding to the function of the switch 21 by responding to the low level voltage (actually a change of voltage from the high level to the low level). Also, the same will apply to a case in which other switches $2_2$, $2_3$, . . . , $2_{(n-1)}$, $2_n$ is in the "ON" state as in the case of the "ON" state of switch $2_1$, and the controller 3 performs control operations corresponding to the functions of the closed switches out of the switches $2_2$, $2_3$, . . . , $2_{(n-1)}$, $2_n$, separately.

In this case the relationship between the "ON" or "OFF" states of the switches $2_1$, $2_2$, $2_3$, . . . , $2_{(n-1)}$, $2_n$ and execution or non-execution of the control operation by the controller can be modified so as to make the controller to perform the control operation corresponding to a closed switch separately, when at least one of the switches $2_1$, $2_2$, $2_3$, . . . , $2_{(n-1)}$, $2_n$ is in the "ON" state, or at the time of high level voltage (actually a change of voltage from the high level to the low level) at an input terminal of the controller 3 corresponding to the closed switch.

While the controller is performing the above stated control operation, if the desired control operation for the automotive control apparatus is completed to keep all of the switches $2_1$, $2_2$, $2_3$, . . . , $2_{(n-1)}$, $2_n$ in the open or closed state for a certain time period, the operation mode of the controller 3 is changed from the normal mode to the sleep mode to suppress power consumption by being driven with the sleep mode setting circuit not shown in the drawings.

Next, when the operation mode of the controller 3 is in the sleep mode before time $t_1$ in FIG. 2(f), if a switch, for example, the switch $2_1$ as shown in time $t_1$ in FIG. 2(a), is operated to change its state from "OFF" to "ON", the voltage at the node between the power supplying resistor $7_1$ and the resistor $4_1$ goes down to conduct the diode $5_1$ and a voltage which changes from the former high level to the low level is supplied to the input terminal $I_1$ of the controller 3 as shown in time $t_1$ of FIG. 2(b).

Figure 2:
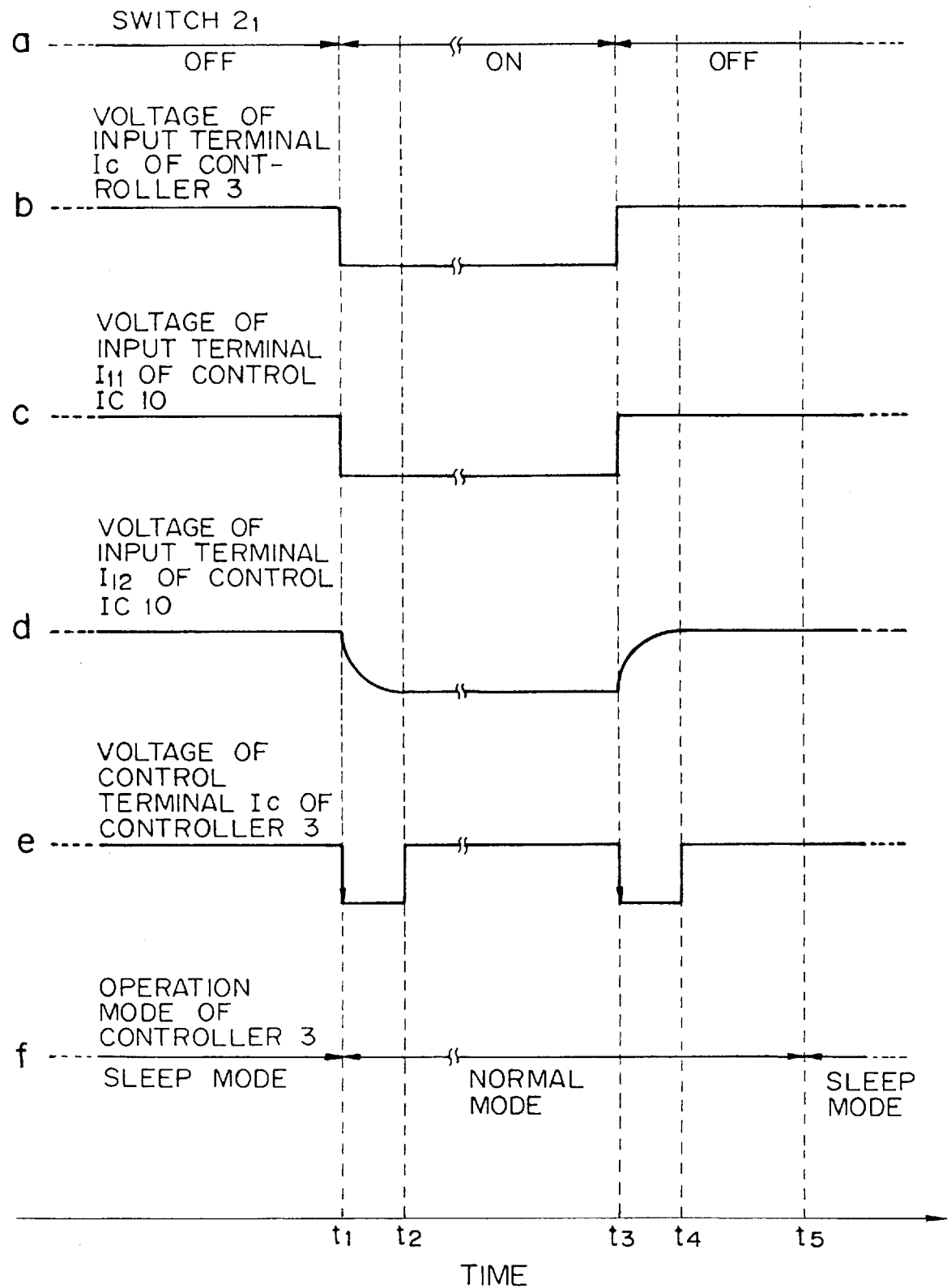
FIG. 2 is a graphical presentation in time sequence of an example of waveforms of voltages obtained in various parts of the circuit including the switch open-close state detecting circuit shown in FIG. 1 and operational modes of various parts thereof.
Figure 3:
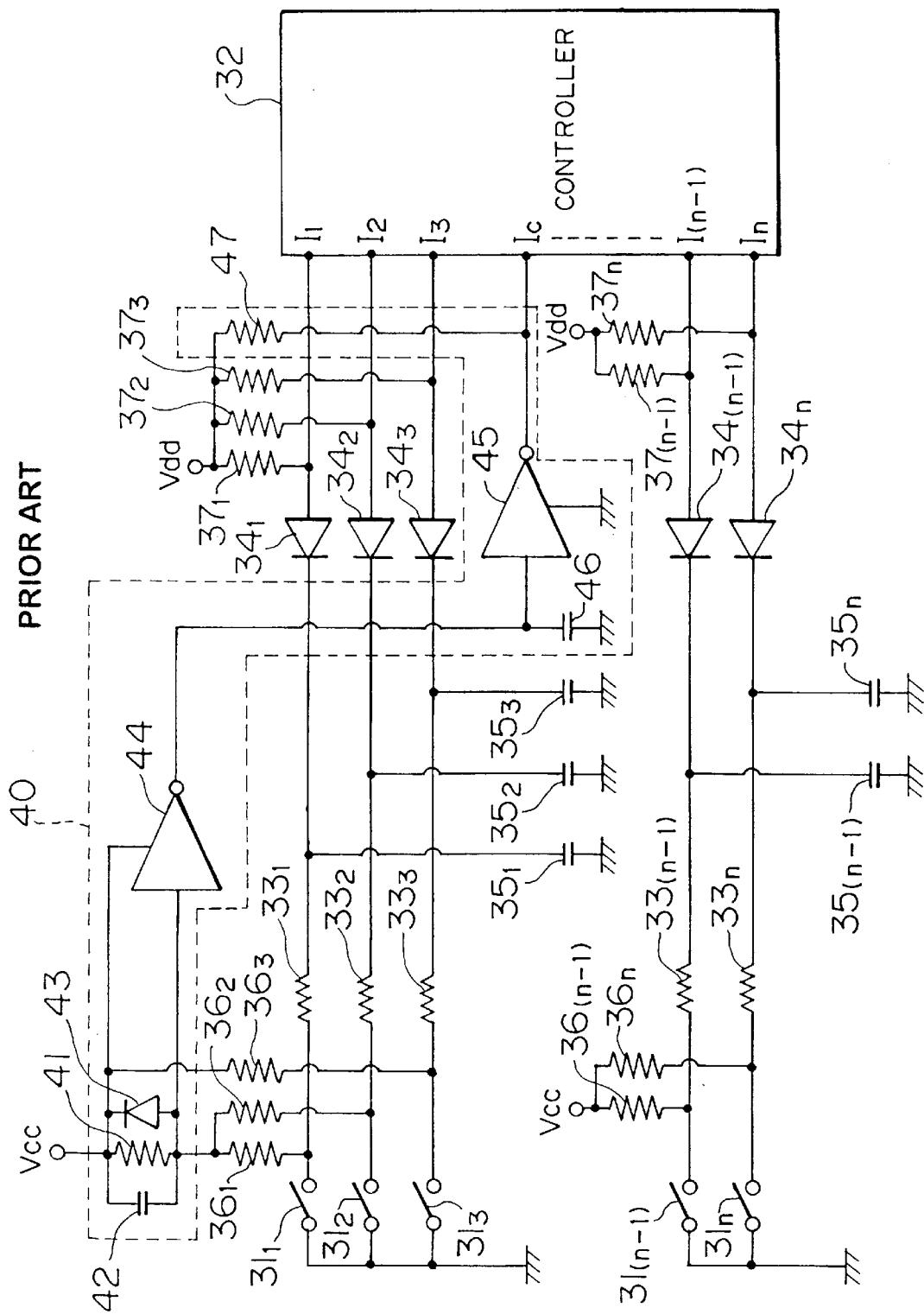
FIG. 3 is an schematic circuit diagram showing an example of the construction of a known switch open-close state-detecting circuit and a circuit surrounding it.

Also, in the switch open-closed state-detecting circuit 1, the voltage changes from the high level to the low level which is supplied to the input terminal $I_1$ is supplied as it is to the input terminal $I_{11}$ of the control IC 10 as shown in time $t_1$ in FIG. 2(c) and at the same time it is delayed with a voltage delay circuit consisting of the resistor $11_1$ and the capacitor $12_1$ to be supplied to the input terminal $I_{12}$ of the control IC 10 as the delayed voltage change. At this time in the control IC 10, the voltage level supplied to the input terminal $I_{11}$ does not coincides with that supplied to the input terminal $I_{12}$ during the time $t_1$ to $t_2$ in FIG. 2 and the voltage supplied to the output terminal $O_1$ corresponding to the pair of input terminal $I_{11}$ and $I_{12}$ turns to the low level in place of the source voltage $V_{dd}$ (the high level) which has been supplied via power supplying resistor 14 up to that time as shown in the time $t_1$ to $t_2$ in FIG. 2(e) to supply this voltage change from the high level to the low level as an interrupt signal to the input terminal $I_c$ of the controller 3. Then, in the controller 3 the operation mode returns from the sleep mode to the normal mode by being supplied with such an interrupt signal as shown in time $t_1$ in the FIG. 2(f) to perform an operation corresponding to the function of the closed $2_1$ due to the voltage change from the high level to the low level supplied to the input terminal $I_1$ as shown in the time $t_1$ in FIG. 2(b).

While the operation mode of the controller 3 is in the sleep mode, if not only the switch $2_1$ but any one of the switches $2_2$, $2_{(n-1)}$, $2_n$, which correspond to the input terminals $I_2$, $I_{(n-1)}$ and $I_n$ of the controller 3 which are connected to the pairs of input terminals $I_{21}$-$I_{22}$, $I_{31}$-$I_{32}$, $I_{41}$-$I_{42}$ of the control IC 10, is closed, the same operation as the above stated case of closing the switch $2_1$ is performed. Namely, when the voltage levels supplied to the pairs of input terminals $I_{21}$-$I_{22}$, $I_{31}$-$I_{32}$, $I_{41}$-$I_{42}$ becomes inconsistent as shown during time $t_1$ to $t_2$ in FIG. 2, an interrupt signal for changing the voltage from the high level to the low level is supplied from output terminals $O_2$, $O_3$ and $O_4$ corresponding to pairs of input terminals $I_{21}$-$I_{22}$, $I_{31}$-$I_{32}$, $I_{41}$-$I_{42}$ to return the operation mode of the controller 3 from the sleep mode to the normal mode and the controller 3 performs a control operation corresponding to the function of the closed one of the switches $2_2$, $2_{(n-1)}$, $2_n$.

By the way, when the operation mode of the controller 3 is in the sleep mode, the above stated interrupt signal in the switch open-close state-detecting circuit 1 is produced, even when at least one of the switches $2_1$, $2_2$, $2_{(n-1)}$, $2_n$, for example, the switch $2_1$ is operated from the closed state to the open state. Namely, as shown at time $t_3$ in the FIG. 2(b), when the switch $2_1$ changes from the "ON" state to the "OFF" state, the voltage levels supplied to the pairs of input terminals $I_{11}$-$I_{12}$ of the control IC 10 become inconsistent during the time $t_3$ to $t_4$ in the FIGS. 2(c) and (d) to supply the interrupt signal for changing from the high level to the low level from the corresponding output terminal $O_1$ as shown at time $t_3$ in FIG. 2(e) like the above case.

As described above, according to the switch open-close state-detecting circuit of this embodiment, change of the state of the two-value voltage with the low level and the high level which is supplied to the input terminals $I_1$, $I_2$, $I_{(n-1)}$, $I_n$ of the controller 3 is detected with the combination of the control IC 10 and the voltage delay circuits 11 and 12 to supply an interrupt signal for changing the voltage from the high level to the low level to the control terminal $I_c$ of the controller 3, so that it is possible to supply an interrupt signal without fail to the control terminal $I_c$ of the controller 3 to return the operation mode of the controller 3 from the sleep mode to the normal mode, whenever any one of the plurality of switches $2_1$, $2_2$, $2_{(n-1)}$, $2_n$ changes to either the open or the closed state.

In this example such switches as, for example, an ON/OFF switch of the key cylinder unlock signal, an ON/OFF switch of the dome/buzzer signal, an ON/OFF switch of the door lock signal and an ON/OFF switch of the door unlock signal are selected for switches to return the operation mode of the controller 3 from the sleep mode to the normal mode upon the operation of the switches $2_1$, $2_2$, $2_{(n-1)}$, $2_n$.

Further, in the above stated embodiment described is an example of application of the switch open-close state-detecting circuit 1 to the automotive control apparatus but the application of the switch open-close state-detecting circuit 1 of the present invention is not only limited to the automotive use but also applicable to any other control apparatuses similar to the automotive control apparatuses.

Also, in the above stated embodiment described is an example in which the control IC 10 of the switch open-close state-detecting circuit 1 has 4 pairs of paired input terminals $I_{11}$-$I_{12}$, $I_{21}$-$I_{22}$, $I_{31}$-$I_{32}$, $I_{41}$-$I_{42}$ and 4 output terminals $O_1$, $O_2$, $O_3$, $O_4$ corresponding to them. However, the control IC 10 for use in the present invention is not limited to the one with 4 pairs of input terminals and 4 output terminals but also the ones with any number more than one of pairs of input terminals and the output terminals will do as long as the number of pairs of input terminals and the output terminals are equal.

As stated above, according to the present invention the monitoring voltage generated from a plurality of switches for monitoring the operation mode is provided separately to a plurality of corresponding pairs of input terminals of the controlling IC and the controlling IC detects in conjunction with the voltage delay circuits a voltage change in the monitoring voltage applied to each of the pairs of input terminals either from the high level to the low level or from the low level to the high level to generate an interrupt signal for changing voltage from the high level to the low level to output terminals corresponding to the pairs of input terminals, so that an effect is available in which even any of the plurality of switches changes to either open or closed state, it is possible to supply the desired interrupt signal to the control terminal of the controller to change the operation mode of the controller from one of the modes (for example the sleep mode) to the other (for example the normal mode).

What is claimed is:

1. A switch open-close state-detecting circuit for controlling the operation modes of a controller by detecting and supplying change of a monitoring voltage to control terminals of said controller, wherein said monitoring voltage is fed to a plurality of switches to supply change of said monitoring voltage corresponding to open-close state of said plurality of switches to a plurality of input terminals of said controller separately, comprising:

a control integrated circuit including a plurality of pairs of input terminals and a plurality of output terminals in a number corresponding to that of said pairs of input terminals for generating an interrupt signal at a corresponding output terminal only when voltages supplied to said pair of input terminals is not equal;

a plurality of delay circuits each connected between input terminals of a plurality of pairs of input terminals of said control integrated circuit;

wherein change of said monitoring voltage of a plurality of switches selected out of said plurality of switches is fed to one of input terminals of said plurality of pairs of input terminals separately to supply interrupt signals obtained at said plurality of output terminals to said control terminal.

2. A switch open-close state-detecting circuit according to claim 1, wherein said controller is a microcomputer mounted in an automobile for controlling operations of various automotive apparatuses, and said plurality of switches are various control switches provided in an automobile.

3. A switch open-close state-detecting circuit according to claim 1, wherein operation modes of said controller are at least a normal operation mode and a sleep mode.

\* \* \* \* \*